United States Patent
Farooq et al.

[19]

[11] Patent Number: 6,015,955
[45] Date of Patent: Jan. 18, 2000

[54] REWORKABILITY SOLUTION FOR WIREBOUND CHIPS USING HIGH PERFORMANCE CAPACITOR

[75] Inventors: Mukta Shaji Farooq, Hopewell Junction; Raymond Alan Jackson, Fishkill; Sudipta Kumar Ray, Wappingers Falls, all of N.Y.

[73] Assignee: International Business Machines Corporation, Armonk, N.Y.

[21] Appl. No.: 08/879,718

[22] Filed: Jun. 20, 1997

[51] Int. Cl.[7] .................................................... H05K 7/02
[52] U.S. Cl. ............................................ 174/260; 361/760
[58] Field of Search .................................. 174/260, 266, 174/262, 255; 361/760

[56] References Cited

U.S. PATENT DOCUMENTS

| | | |
|---|---|---|
| 4,668,041 | 5/1987 | La Komski et al. . |
| 4,675,717 | 6/1987 | Herrero et al. . |
| 4,945,399 | 7/1990 | Brown et al. . |
| 4,989,117 | 1/1991 | Hernandez . |
| 5,016,087 | 5/1991 | Haug et al. . |
| 5,034,850 | 7/1991 | Hernandez et al. . |
| 5,089,881 | 2/1992 | Panicker . |
| 5,095,402 | 3/1992 | Hernandez et al. . |
| 5,134,539 | 7/1992 | Tuckerman et al. . |
| 5,162,264 | 11/1992 | Haug et al. . |
| 5,177,594 | 1/1993 | Chance et al. . |
| 5,241,133 | 8/1993 | Mullen, III et al. .................... 174/52.4 |
| 5,272,590 | 12/1993 | Hernandez . |
| 5,283,717 | 2/1994 | Hundt . |
| 5,311,057 | 5/1994 | McShane . |
| 5,355,283 | 10/1994 | Marrs et al. ............................ 361/760 |
| 5,410,107 | 4/1995 | Schaper ................................... 174/255 |
| 5,557,844 | 9/1996 | Bhatt et al. .............................. 29/852 |
| 5,767,575 | 6/1998 | Lan et al. ................................ 257/701 |

*Primary Examiner*—Hyung-Sub Sough
*Assistant Examiner*—William Silverio
*Attorney, Agent, or Firm*—Ratner & Prestia; Tiffany L. Townsend

[57] ABSTRACT

A device and method for enabling the reworkability of an integrated circuit. The device includes a wirebond chip having a bottom surface and a carrier substrate having a first surface and a second surface. The first surface and second surface of the carrier substrate are electrically connected through a series of vias. A bonding agent is used to mechanically attach the wirebond chip to the carrier substrate in addition to wirebonds for electrically connecting the wirebond chip to the substrate. The substrate is attached to a multi-chip module (MCM) by ball grid array (BGA) or controlled collapse chip connection (C4) attaching process.

11 Claims, 6 Drawing Sheets

REWORKABILITY SOLUTION FOR WIREBOUND CHIPS USING HIGH PERFORMANCE CAPACITOR

FIELD OF THE INVENTION

The present invention relates generally to integrated circuits and, more particularly, to an apparatus and method for enabling the reworkability of an integrated circuit.

BACKGROUND OF THE INVENTION

Circuit boards with multiple Very Large Scale Integrated (VLSI) circuit chips are called Multi-Chip Modules (MCM)- The use of VLSI circuits presents interface problems relating to the interconnection of the integrated circuits to other circuits and the placement of the integrated circuits on a ceramic circuit board (MCM-C). As VLSI technology has advanced, the density of circuits on a single VLSI chip has increased and the necessary interconnection for VLSI chips has become increasingly difficult to achieve in a limited space.

In a typical configuration, semiconductor chips are mounted in cavities on multilayer circuit boards or substrates and the substrates accommodate intercircuit connections through tiny vertical holes or vias between the layers. In the case of wirebond chips, the chips are connected to the vias using bonding wires which are welded to the interconnection pads on the chip and the pads connected to the vias on the substrate. The vias are filled with a conductive material, such as molybdenum paste, which creates a connection to the VLSI circuit.

Reworkability is an issue for a wirebond chip which is attached to a substrate. This is generally not an issue for Single Chip Modules (SCMs), where the chip carrier can be thrown away (with the chip) after burn-in and test. For MCMs where only wirebond chips are used, however, reworkability is mandatory to prevent loss of the entire module, even if bare die burn-in has preceded chip attachment.

FIG. 1 shows a typical application using a wirebond chip. In FIG. 1, wirebond chip 10 is mechanically attached to substrate 12 by bonding agent 14. Wirebond chip 10 is electrically connected to substrate 12 by bonding wire 16 at via 18. This prior art application has the disadvantage that removal of wirebond chip 10 from substrate 12 results in loss of the module due to the nature of the removal process, as well as the destruction of the wirebond chip, preventing defect analysis and diagnostics of the chip.

Reworks in high speed MCMs are driven primarily due to speed imbalances among the individual chips on the MCM. This problem is exacerbated with Complementary Metal Oxide Semiconductor (CMOS) technology, where speed sorts of wafer level burn-in carriers are accurate to only within 10–15%. So an MCM designed to run at 100 MHz may not function properly with a microprocessor chip sorted at 90±10 MHz. This has been borne out by recent experiences with MCMs.

In addition to the reworkability issue, high performance micros/Application Specific Integrated Circuit (ASIC) chips require a large amount of decoupling capacitance (1 to 3 $\mu$F). Because a wirebond chip image is significantly larger than an equivalent controlled-collapsed-chip-connection (C4) chip image on an MCM, on module discrete decoupling capacitors do not work as well as capacitors that lie directly beneath the chip. U.S. Pat. No. 5,095,402 issued to Hernandez et al. illustrates a decoupling capacitor placed within an integrated circuit package. As illustrated in FIG. 2, wirebond chip 20 is attached to an IC carrier 22. Bonding wire 26 electrically connects wirebond chip 20 with pads 28 of carrier 22. A decoupling capacitor 24 is attached to wirebond chip 20. This prior art also exhibits the drawback that wirebond chip 20 cannot be removed from carrier 22 without destroying the carrier.

FIG. 3 shows a typical MCM 30 which has nine sites 32 for mounting dice 34, 36, etc. If, for example, die 34 is defective due to an improper wirebond, solder joint, or speed intolerance, the entire MCM 30 must be scrapped because conventional mounting methods of dice 34, 36, etc. do not provide for non-destructive removal of the defective die.

FIG. 4 illustrates a conventional method of mounting electronic components 40 to a substrate 42. This conventional method uses solder balls 44 to attach component 40 to substrate 42. This method has a drawback, however, in that decoupling capacitors (not shown) must be attached to substrate 42 at locations remote from component 40. In addition, physical constraints limit the amount of decoupling available to any given component. This results in insufficient decoupling of high frequency noise resulting in inferior high speed performance of the assembled MCM.

Bearing in mind the problems and deficiencies of the prior art, it is therefore an object of the present invention to provide an apparatus and method for enabling the reworkability of an integrated circuit. It is another object of the present invention to enhance the operation of an integrated circuit. It is a further object of the present invention to provide a carrier substrate to attach to a wirebond chip which allows for reworkability of an integrated circuit attached to a multi-chip module. It is another object of the present invention to provide a reworkable multi-chip module with a decoupling capacitor integral with each wirebond chip. Still another object of the present invention is to provide a wirebond chip attached to a substrate which is attached to a multi-chip module using ball grid array (BGA) or controlled collapse chip connection (C4) attachment methods. It is another object of the present invention to provide a burn-in test vehicle capable of operating at speeds of up to 800 MHz. Finally, it is another object of the present invention to allow non-destructive diagnostics of a chip wire bonded to a carrier.

SUMMARY OF THE INVENTION

An interposer is manufactured incorporating an integral capacitance layer. The top surface of the interposer has wirebond pads to accept a wirebond chip. The wirebond chip is die attached and then bonded to the pads on the top surface metallurgy (TSM). The wirebond pads on the TSM pads are connected to the bottom surface metallurgy (BSM) by thru vias. The BSM is C4 pads or BGA pads. Using this structure, a wirebond chip from a package can now be removed and replaced without the loss of the entire package. Previously, it was not possible to rework a wirebond chip, and thus wirebond chips were never placed on MCM's as one defective or out-of-tolerance chip caused the entire module to be scrapped.

Using the integral capacitance layer interposer, when a wirebond chip fails, the interposer can be removed by either hot vacuum, or in-situ device removal. In hot vacuum, the module is placed in a box oven and at liquidous temperature and the interposer is lifted from the module by means of vacuum. In in-situ device removal, the interposer is gripped and lifted from the module at liquidous temperature through a belt furnace using bimetallic disks to cause the lifting action. The module site is then dressed of residual solder by either copper block or shave process and a replacement interposer is reattached to the module.

To solve the aforementioned disadvantages of conventional integrated circuit mounting arrangements, the present invention relates to an apparatus and method for enabling the reworkability of an integrated circuit. The apparatus comprises a wirebond chip and a carrier substrate. The wirebond chip is attached to the top of the carrier substrate and is electrically connected to the bottom surface of the carrier substrate. The dielectric layer provides high decoupling capacitance which is required to minimize power supply noise in high speed processors.

The present invention also relates to an apparatus for enabling the reworkability and operation of an integrated circuit employing a wirebond chip, a carrier substrate, and a dielectric layer attached to the surface of the carrier substrate.

The present invention further relates to an apparatus for mounting a wirebond chip to a module using a carrier substrate having structure for connecting the carrier substrate to the wirebond chip, a dielectric layer attached to the carrier substrate, and a device for attaching the bottom surface of the carrier substrate to the module.

The present invention relates still further to a method for mounting a wirebond chip to a module comprising the steps of attaching a bottom surface of a dielectric layer to a top surface of a carrier substrate, bonding a bottom surface of the wirebond chip to a top surface of the dielectric layer, coupling a plurality of electrical connections on the wirebond chip to a respective plurality of connections on the dielectric film, and coupling the bottom surface of the carrier substrate to the module.

The present invention finally relates to a method for enabling the reworkability of the wirebond chip and the module comprising the additional steps of decoupling the bottom surface of the carrier substrate from the module and coupling a bottom surface of a further carrier substrate having a wirebond chip attached thereto to the module.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENTS

Figure 1:
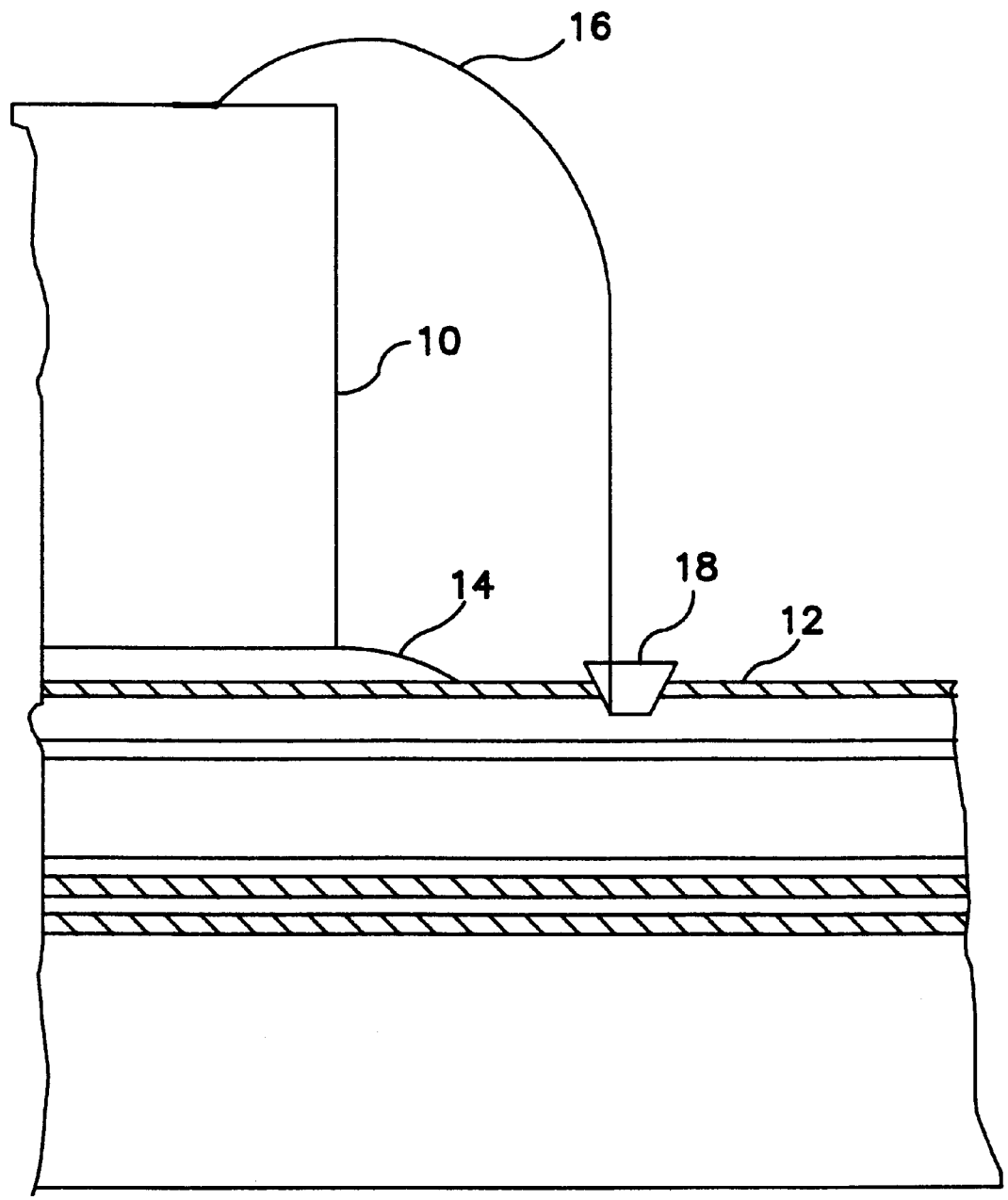
FIG. 1. is a partial side view of a prior art wirebond chip attachment.
Figure 2:
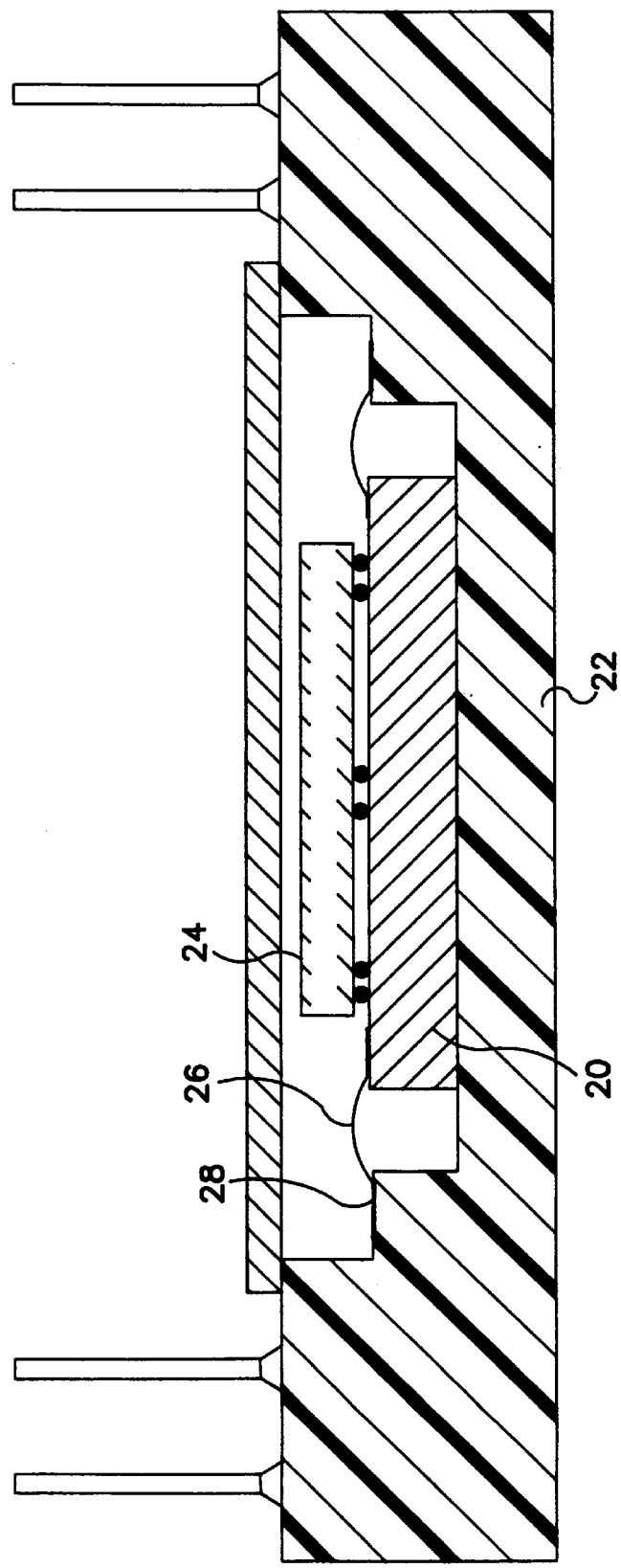
FIG. 2 is a side view of a prior art integrated circuit with an integral decoupling capacitor.
Figure 3:
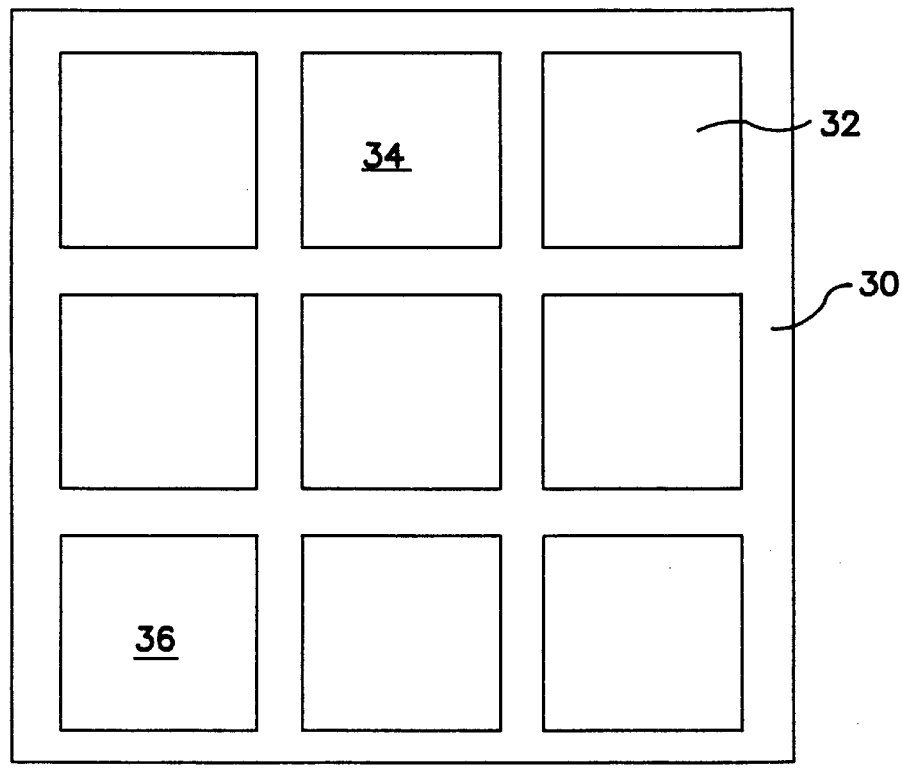
FIG. 3 is a plan view of a prior art multi-chip module.
Figure 4:
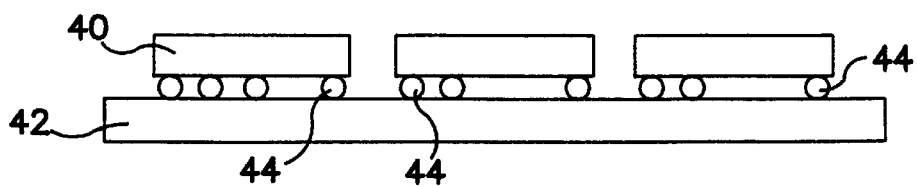
FIG. 4 is a side view of a typical BGA attachment of devices to a multi-chip module.
Figure 5:
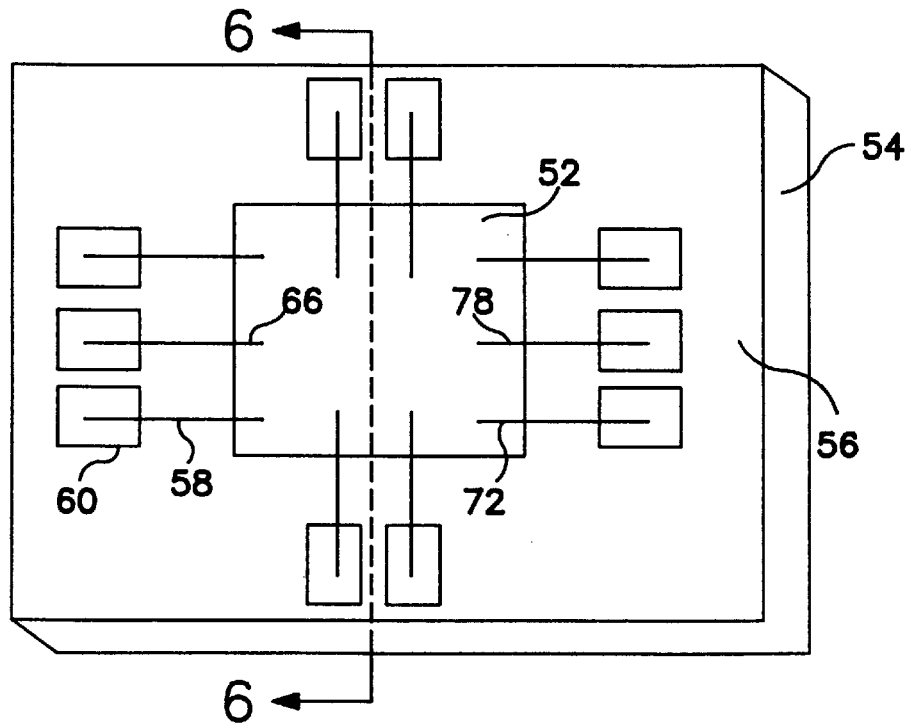
FIG. 5 is a plan view of an exemplary embodiment of the present invention.

Referring to FIG. 5, a top view of chip carrier 54 shows semiconductor die 52 which is wire bonded to chip carrier 54 with high dielectric layer 56. Die 52 is mechanically bonded to chip carrier 54 by bonding material (not shown), such as epoxy, for example. Die 52 is electrically connected to chip carrier 54 by wire leads 58. Wire leads 58 are bonded to surface pads 60 which are fabricated on top of the dielectric layer 56. Wire leads 58 may be connected to a ground voltage plane (not shown) or to a power voltage plane (not shown), or may be a signal lead which is not connected to any voltage plane. For those skilled in the art, it will be apparent that any combination of the signal, ground, and power connections can be utilized depending on the specific performance requirements of the semiconductor device.

Figure 6:
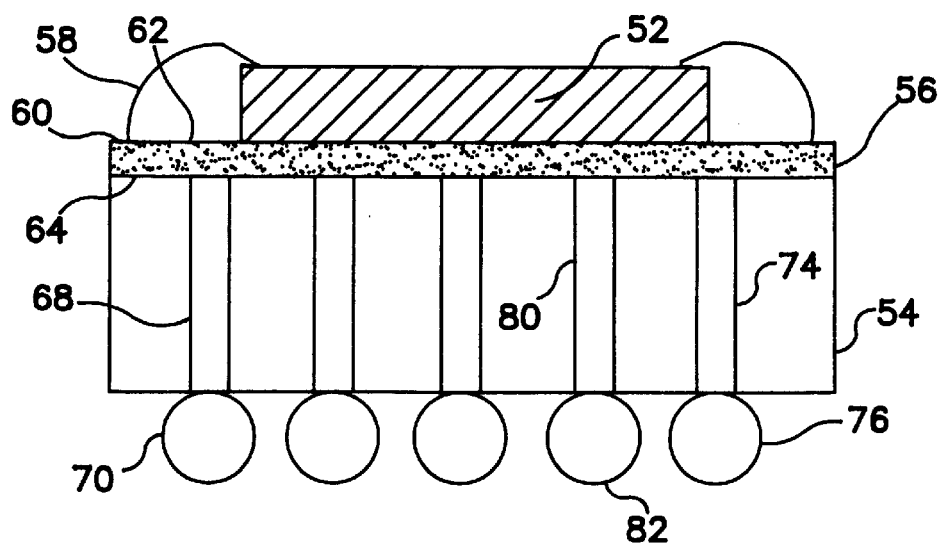
FIG. 6 is a sectional view of the exemplary embodiment of FIG. 5 through section 6—6.

Referring to FIG. 6, a partial sectional view of chip carrier 54 shows die 52 attached to chip carrier 54 by wire leads 58. Chip carrier 54 has fabricated on its surface a dielectric layer 56. The dielectric layer 56 has metal mesh layers 62, 64 fabricated on both sides which act as the voltage layers. For example, referring to FIGS. 5 and 6, chip connection 66 is bonded to ground metal mesh layer 62 which is connected through via 68 and BGA 70 to a ground connection (not shown). Similarly, chip connection 72 is bonded to voltage metal mesh layer 64 which is connected through via 74 and BGA 76 to a voltage level used to power the chip. Typically, such voltage levels in microprocessor applications are between 2.5 and 5 volts. Finally, signal connection 78 from die 52 is connected through via 80 to BGA 82. This signal connection 78 is isolated from any voltage or power mesh layers in the dielectric layer 56.

Figure 7:
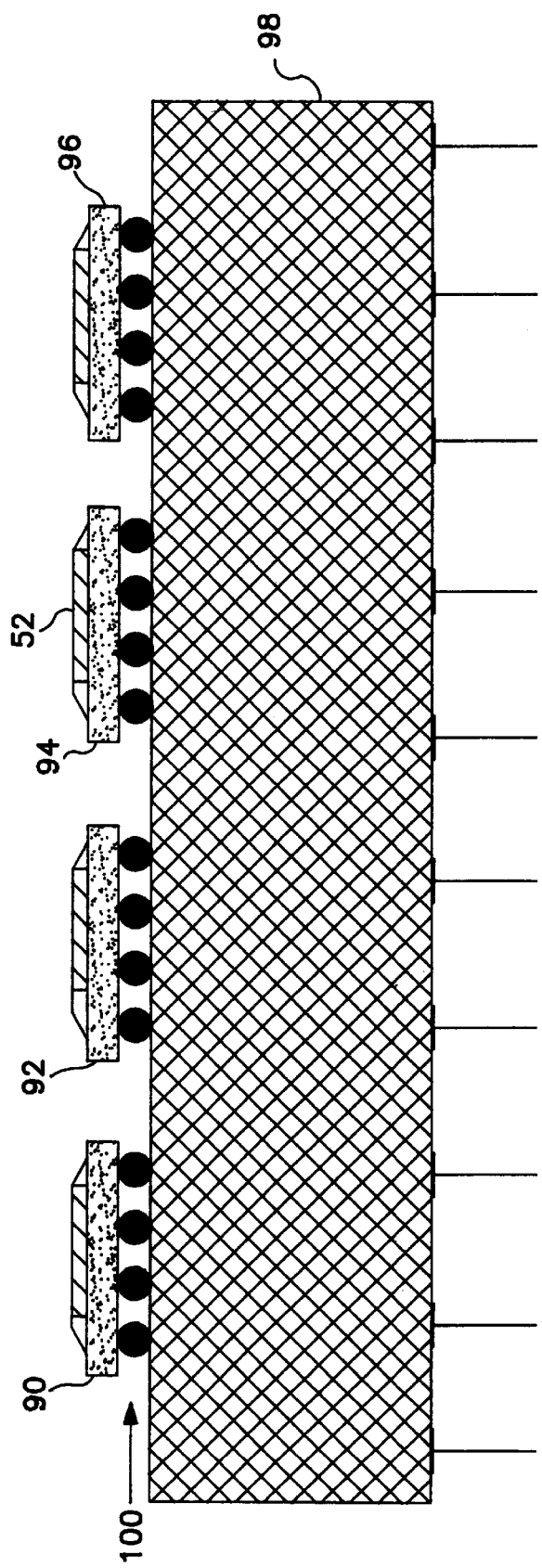
FIG. 7 is a side view of an MCM of the present invention.

Referring to FIG. 7, a side view of an MCM of the present invention is shown. In FIG. 7 carrier substrates 90, 92, 94, and 96 are shown attached to the multi-chip module 98 (MCM) utilizing the ball grid array assembly 100 (BGA). Each carrier substrate 90, 92, 94, and 96 has the integral high dielectric thin film capacitor layer 56 as shown in FIG. 6. Semiconductor dice, such as 52 shown in FIG. 5, are attached to MCM 98 by a standard wirebond process used in the industry. After multiple carrier substrates 90, 92, 94, and 96 are attached to MCM 98, MCM 98 is tested for chip to chip connection at speed. MCM 98 may either be a production item or a test vehicle to test the carrier substrates 90, 92, 94, and 96 at operational speeds or testing speeds. Typically, these testing speeds may range from 400–800 MHz or more. At this stage, due to timing issues associated with the industry, removal of a carrier substrate, such as 90, 92, 94, and 96 from a multiple chip carrying substrate, due to failures or speed intolerances for example, is known as "rework".

A key advantage of the structure disclosed in this invention is that individual chip carriers 90, 92, 94, and 96 are attached to the substrate by an array of solder balls or BGA 100, for example. Other attaching methods such as controlled collapse chip connection (C4) or low melting point solder, for example, may also be used in place of BGA 100. In this way, the defective carrier substrate 90, 92, 94, and 96 may easily be removed without destroying the underlying MCM 98. In addition, when MCM 98 is used as a testing vehicle, removal of carrier substrate 90, 92, 94, and 96 which passed testing, is easily accomplished such that carrier substrate 90, 92, 94, and 96 may be used in further stages of production, such as incorporation in a production module, for example. This later procedure will enhance the throughput of MCMs by minimizing rework on production modules.

Carriers 90, 92, 94, and 96 attached to MCM 98 with BGA 100, can be removed from an organic card or ceramic substrate, for example, by utilizing a process of melting the solder ball of BGA 100 and removing the carrier substrate 90, 92, 94, and 96 during the time the balls are molten. In FIG. 7, for example, if chip carrier 92 is found to be defective, either due to a chip timing problems or a defective connection between the chip die 52 and the MCM 98, the chip carrier 92 can be removed from the MCM 98 without affecting other carriers such as 90, 94 and 96. A new BGA chip carrier is then attached to MCM 98.

If the multiplicity of wirebond dice such as 52 were attached directly to the MCM 98, individual removal of defective die, followed by reattachment using conventional wirebond methods, would not be possible. This invention allows high speed chips, which are designed for wirebond attachment, to be used on multi-chip carrying cards or ceramic substrates without the attendant drawbacks heretofore experienced.

Figure 8:
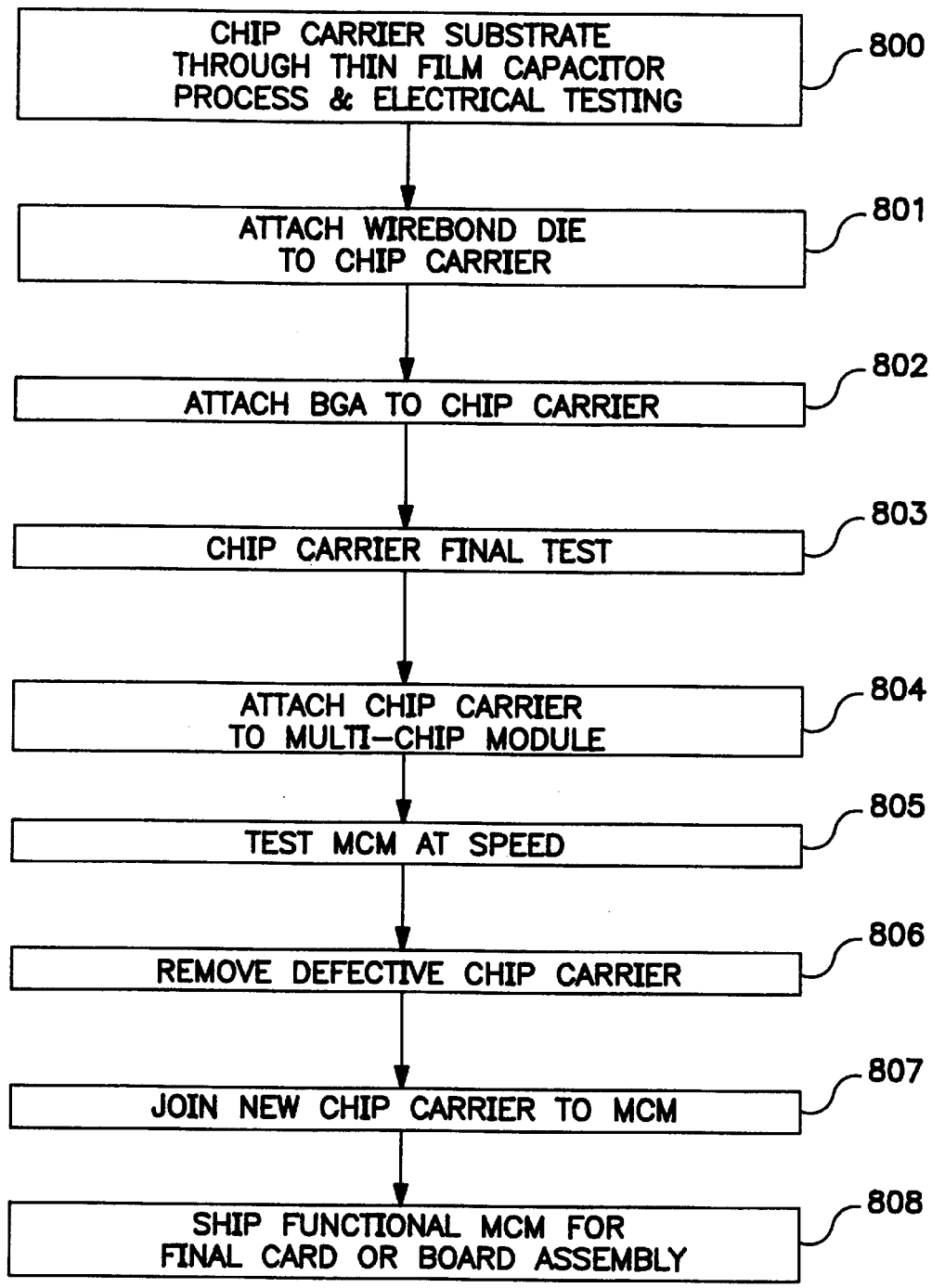
FIG. 8 is a flow chart outlining a method of an exemplary embodiment of the present invention.

FIG. 8 is a flow chart illustrating a method according to an exemplary embodiment of the present invention. In Step 800, a chip carrier substrate and high dielectric thin film capacitor is fabricated and tested. In Step 801, the wirebond chip is attached to the chip carrier/thin film capacitor combination using conventional wirebond techniques. In Step 802, the BGA is attached to the unoccupied surface of the carrier substrate. In Step 803, the carrier substrate containing the wirebond chip, BGA, and thin film capacitor is tested. In Step 804, the carrier substrate which passed Step 803 is attached to a MCM. In Step 805, the MCM is tested at a predetermined speed to identify defective or out of tolerance circuits. In Step 806, if necessary, the defective carrier substrates are removed from the MCM. In Step 807, a new chip carrier is attached to the MCM to replace the substrate removed in Step 806. Finally, in Step 808, the completely functional MCM is completed and passed for final installation or shipment. Thus, according to this exemplary method, a defective carrier substrate containing a wirebond chip may be easily removed from the MCM without destroying the MCM thereby resulting in significant cost savings over conventional methods.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. An apparatus for enabling the reworkability and operation of an integrated circuit comprising:
    a wirebond chip having a bottom surface,
    a carrier substrate having
        1) a first surface,
        2) a second surface, and
        3) connecting means for connecting the first surface of the carrier substrate to the second surface of the carrier substrate,
    a dielectric laser attached to the first surface of the carrier substrate and having an upper surface and a lower surface, and
    attaching means for directly attaching the wirebond chip to the dielectric layer,
    wherein the dielectric layer has a metal layer on said upper surface.

2. The apparatus of claim 1, wherein the connecting means of the carrier substrate is a via.

3. The apparatus of claim 1, wherein the attaching means includes:
    a bonding agent for fixedly attaching the bottom surface of the wirebond chip to the upper surface of the dielectric layer, and
    a wire for electrically coupling a plurality of connections on the wirebond chip to a respective plurality of connections on the upper surface of the dielectric layer,
    wherein said plurality of connections on the upper surface of the dielectric layer connect to a respective plurality of connections on the first surface of the carrier substrate.

4. The apparatus of claim 3, wherein the connecting means of the carrier substrate is a plurality of vias for connecting each of the plurality of connections on the first surface of the carrier substrate to a respective one of a plurality of connections on the second surface of the carrier substrate.

5. An apparatus for mounting a wirebond chip having a bottom surface to a module comprising:
    a carrier substrate having
        1) a first surface,
        2) a second surface, and
        3) connecting means for connecting the first surface of the carrier substrate to the second surface of the carrier substrate,
    a dielectric layer attached to the first surface of the carrier substrate and having an upper surface and a lower surface,
    a first attaching means for directly attaching the wirebond chip to the dielectric layer, and
    a second attaching means for attaching the second surface of the carrier substrate to the module,
    wherein the first attaching means includes:
        a bonding agent for fixedly attaching the bottom surface of the wirebond chip to the upper surface of the dielectric layer, and
        a wire for electrically coupling a plurality of connections on the wirebond chip to a respective plurality of connections on the upper surface of the dielectric layer,
        wherein said plurality of connections on the upper surface of the dielectric layer connect to a respective plurality of connections on the first surface of the carrier substrate.

6. The apparatus of claim 5, wherein the module is a multi-chip module.

7. The apparatus of claim 6, wherein the module is a ceramic multi-chip module.

8. The apparatus of claim 6, wherein the module is an organic multi-chip module.

9. The apparatus of claim 5, wherein the second attaching means is one of a ball grid array (BGA) or a controlled collapse chip connection (C4).

10. The apparatus of claim 9, wherein the second attaching means is a low melting point solder BGA.

11. The apparatus of claim 9, wherein the second attaching means is a low melting point solder C4 array.

* * * * *